(12) United States Patent
Lee (10) Patent No.: US 7,538,384 B2
(45) Date of Patent: May 26, 2009

(54) NON-VOLATILE MEMORY ARRAY STRUCTURE

(75) Inventor: Tzyh-Cheang Lee, Hsinchu (TW)

(73) Assignee: Taiwan Semiconductor Manufacturing Company, Ltd., Hsin-Shu (TW)

( * ) Notice: Subject to any disclaimer, the term of this patent is extended or adjusted under 35 U.S.C. 154(b) by 0 days.

(21) Appl. No.: 11/294,280

(22) Filed: Dec. 5, 2005

(65) Prior Publication Data

US 2007/0126053 A1 Jun. 7, 2007

(51) Int. Cl.
*H01L 29/792* (2006.01)
(52) U.S. Cl. ............ 257/324; 257/401; 257/E29.309
(58) Field of Classification Search ............ 257/324
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 6,734,063 B2 | 5/2004 | Willer et al. | |
| 6,878,988 B1 * | 4/2005 | Lee et al. | 257/324 |
| 6,952,366 B2 | 10/2005 | Forbes | |
| 6,958,272 B2 | 10/2005 | Lingunis et al. | |
| 2002/0151123 A1 * | 10/2002 | Torii | 438/196 |
| 2004/0207001 A1 | 10/2004 | Kouznetsov et al. | |
| 2005/0237797 A1 | 10/2005 | Jeng | |
| 2005/0265077 A1 * | 12/2005 | Lee et al. | 365/185.17 |

OTHER PUBLICATIONS

Eitan, B., et al., "Can NROM, a 2-bit, Trapping Storage NVM Cell, Give a Real Challenge to Floating Gate Cells?," International Conference on Solid State Devices and Materials (1999) pp. 1-3.
Eitan, B., et al., "NROM: A Novel Localized Trapping, 2-Bit Nonvolatile Memory Cell," IEEE Electron Device Letters, vol. 21, No. 11 (Nov. 2000) pp. 543-545.
Hsieh, C.-S., et al., "NVM Characteristics of Single-MOSFET Cells Using Nitride Spacers with Gate-to-Drain NOI," IEEE Transactions on Electron Devices, vol. 51, No. 11 (Nov. 2004) pp. 1811-1817.
Swift, C.T., et al., "An Embedded 90nm SONOS Nonvolatile Memory Utilizing Hot Electron Programming and Uniform Tunnel Erase," International Electron Devices Meeting (Dec. 2002) pp. 927-930.

* cited by examiner

*Primary Examiner*—Tu-Tu V Ho
(74) *Attorney, Agent, or Firm*—Slater & Matsil, L.L.P.

(57) ABSTRACT

A memory array having a smaller active area pitch is provided. In accordance with embodiments of the present invention, active regions are formed in a substrate and transistors are formed between adjacent active regions such that the active regions form the source/drain regions of the transistors. Word lines are formed perpendicular to the active regions and are electrically coupled to the gates of the transistors. Bit lines may be formed over the active regions to provide electrical contacts to the source/drain regions. In an embodiment, the word lines may be formed of poly-silicon over a layer of dielectric material formed over the transistors. In this embodiment, the bit lines may be formed on the metal layers. The word lines and dielectric layer may have a planar or non-planar surface.

20 Claims, 10 Drawing Sheets

NON-VOLATILE MEMORY ARRAY STRUCTURE

TECHNICAL FIELD

The present invention relates generally to semiconductor devices and, more particularly, to a memory cell layout for integrated circuits.

BACKGROUND

Generally, memory chips comprise an array of memory cells interconnected by bit lines and word lines. The word lines and bit lines are used to read and write binary values to each of the memory cells, wherein each memory cell represents a bit of information. Traditional memory cells typically used combinations of transistors and/or capacitors to represent each bit of information. As memory sizes are reduced, other types of memories are being developed that allow two bits of information to be stored in each memory cell.

One type of memory cell is a silicon-oxide-nitride-oxide-silicon (SONOS) flash memory cell. Traditional SONOS memory cells are based on a transistor having a multi-layer gate electrode that uses an oxide-nitride-oxide (ONO) structure for trapping and storing charges representing a logical "1" or "0" near each of the source and drain regions, thereby storing 2 bits per cell. This type of traditional SONOS memory cell, however, does not allow for decreasing the size of the channel region, thereby limiting the size reduction of a memory cell.

Recent advancements have led to a sidewall SONOS memory cell in which charges are trapped in the nitride spacers formed alongside the gate. While this type of SONOS memory cell allows for a shorter channel length, the size of the memory cell is large due to the large active area required for the contacts between the bit lines and the source/drain regions.

Figure 1:
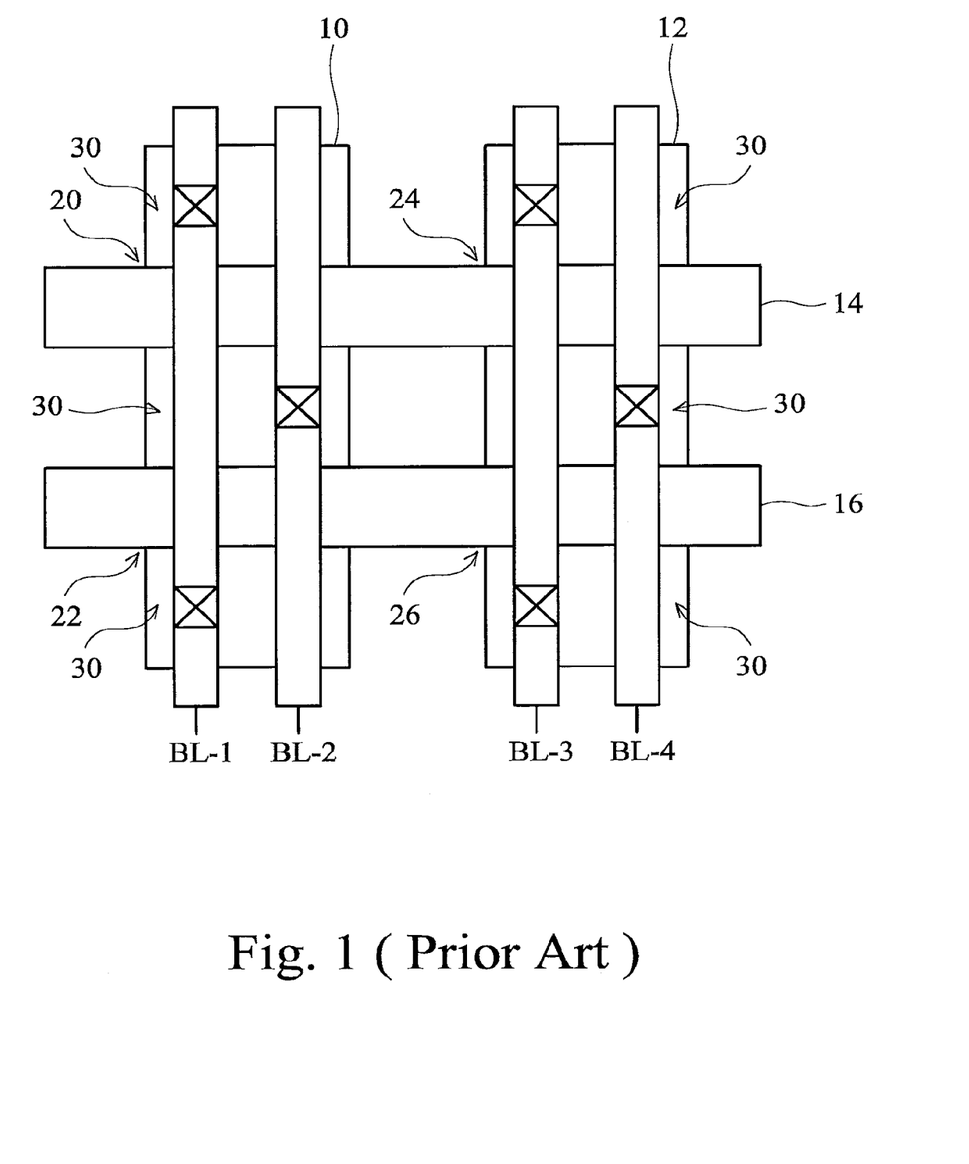
FIG. 1 is a plan view of a typical SONOS memory array layout.

For example, FIG. 1 illustrates a layout for a sidewall SONOS memory array. The SONOS memory array includes active regions 10 and 12 intersected by word lines 14 and 16, thereby forming transistors 20, 22, 24, and 26. Each transistor 20, 22, 24, and 26 has source/drain regions 30. Bit lines BL-1, BL-2, BL-3, and BL-4 are electrically coupled to either a source region or a drain region via contacts (indicated by a square with an "X" on the bit lines). As discussed above, a bit of information may be stored on both the source and drain sides of the charge-trapping nitride layer, e.g., a floating gate or a spacer.

As illustrated in FIG. 1, however, the active regions 10 and 12 must be relatively wide. The wider active regions 10 and 12 are necessitated by the need to have contacts for two bit lines, one each for the source region and the drain region. These larger active regions result in larger memory array size, thereby limiting the size reduction and scaling of the SONOS memory array.

Thus, there is the need for a memory cell layout for a SONOS-type memory array that requires less area and is more scaleable.

SUMMARY OF THE INVENTION

These and other problems are generally reduced, solved or circumvented, and technical advantages are generally achieved, by embodiments of the present invention, which provides a memory cell layout for integrated circuits.

In an embodiment, a memory array having active regions formed in a substrate and transistors formed between adjacent active regions such that the active regions form the source/drain regions of the transistors is provided. In this embodiment, active regions having substantially parallel longitudinal axes are provided, and a plurality of transistors, such as a SONOS-type transistor capable of storing two bits of information, is formed between the adjacent active regions such that the adjacent active regions act as source/drain regions for the transistors. Word lines are formed perpendicular to the active regions and are electrically coupled to the gates of the transistors, and bit lines are formed over the active regions to provide electrical contacts to the source/drain regions.

In an embodiment, a dielectric layer is formed over the transistors and the word lines are formed over the dielectric layer. The word lines may be formed of poly-silicon. The dielectric layer may be planarized prior to forming the word lines, or the dielectric layer may have a non-planar surface. In yet other embodiments, the word line is formed on a metal layer.

It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

The object and other advantages of this invention are best described in the preferred embodiment with reference to the attached drawings that include.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. In particular, the method of the present invention is described in the context of a memory array of SONOS memory cells using a nitride spacer as a trapping region. One of ordinary skill in the art, however, will appreciate that features of the present invention described herein may be used for forming other types of devices, such as a planar SONOS memory cell having a nitride layer in the gate electrode that serves as a trapping layer. Furthermore, embodiments of the present invention may be used as stand-alone memory devices, memory devices integrated with other integrated circuitry, or the like. Accordingly, the specific embodiments discussed herein are merely illustrative of specific ways to make and use the invention, and do not limit the scope of the invention.

Figure 2:
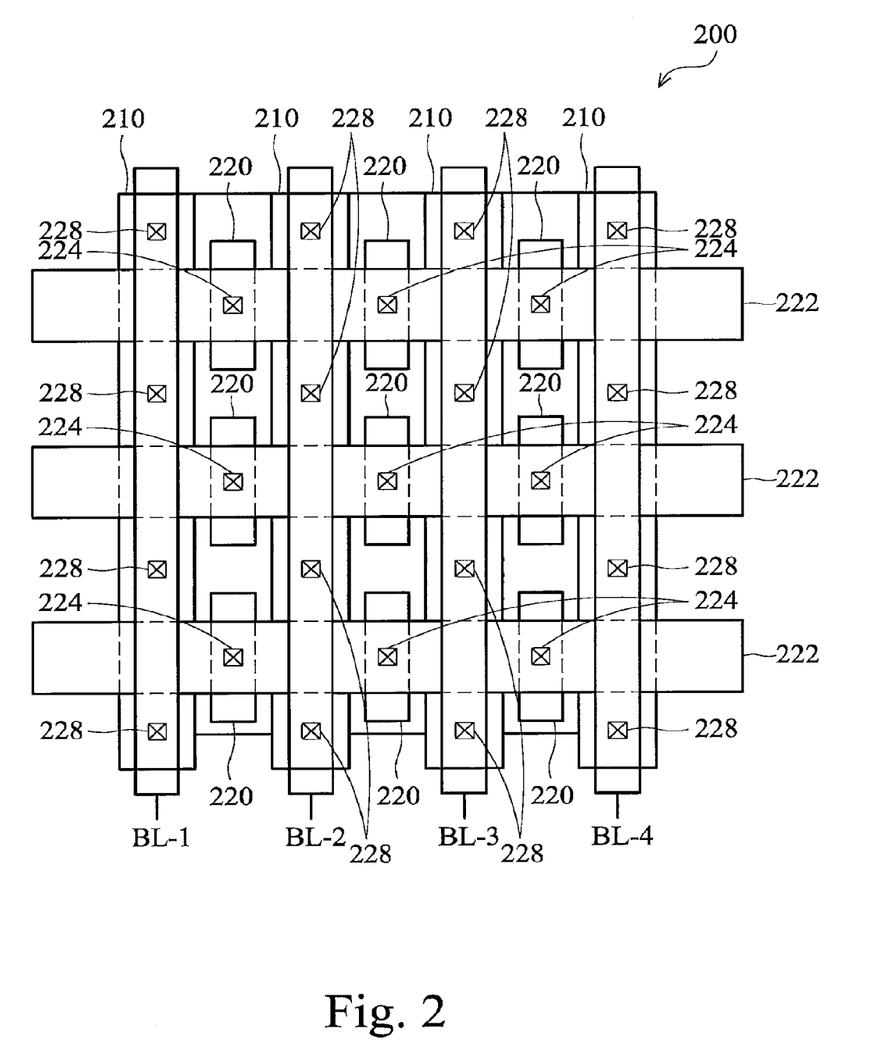
FIG. 2 is a plan view of a SONOS memory array layout in accordance with one embodiment of the present invention.

Referring first to FIG. 2, a plan view of a memory array layout 200 is shown in accordance with an embodiment of the present invention. The memory array layout 200 comprises active regions 210, each having a longitudinal axis arranged in a substantially parallel manner. In an embodiment, the active regions 210 have non-linear edges such that corresponding portions of the active regions 210 extend toward an adjacent active region, intersecting a gate of a transistor, such as gates 220. As illustrated in FIG. 2, in an embodiment the gates 220 may have a rectangular shape positioned between adjacent active regions and have a longitudinal axis substantially parallel to the longitudinal axis of the active regions 210. Word lines 222 extend over the memory array layout 200 such that a longitudinal axis of the word lines 222 is substantially perpendicular to a longitudinal axis of the active regions 210. Word line contacts 224 are formed between the word lines 222 and the underlying gates 220 and are indicated by a square with an "X" inside. Bit lines BL-1, BL-2, BL-3, and BL-4 have a longitudinal axis substantially parallel to the longitudinal axis of the underlying active regions 210. Bit line contacts 228 are formed between the bit lines BL-1, BL-2, BL-3, and BL-4 and the underlying active regions 210 and are indicated by a square with an "X" inside.

In this embodiment, one bit of information may be stored on each side of the gates 220. For example, a single bit of information may be stored at each gate 220 along the bit line BL-1, and another bit of information may be stored at each gate 220 along the bit line BL-2. Such a memory layout allows for a smaller active region dimension than that discussed above, allowing for a smaller memory array size for a given memory.

FIGS. 3a-3e, 4a-4d, and 5a-5e illustrate three embodiments that may be used to form a memory array layout as discussed above in accordance with an embodiment of the present invention.

Referring first to FIGS. 3a-3e, FIG. 3a illustrates a substrate 310 having a transistor 312 formed thereon. The substrate 310 may comprise bulk silicon, doped or undoped, or an active layer of a semiconductor-on-insulator (SOI) substrate. Generally, an SOI comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

Figure 3A:
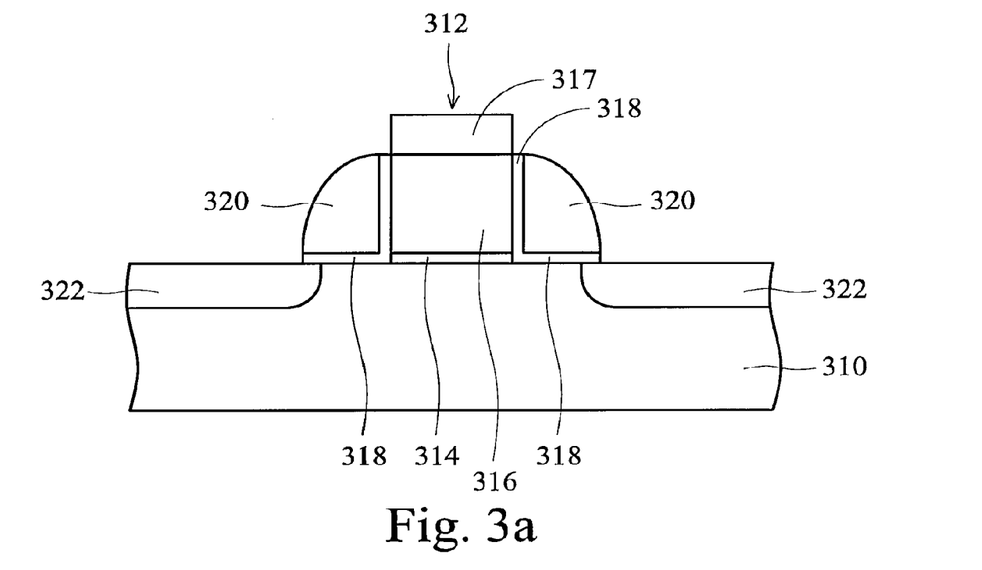
FIGS. 3a-3e are cross-sectional views of a wafer after various process steps are performed in accordance with an embodiment of the present invention.

A gate dielectric layer 314 and a gate electrode 316 are formed and patterned as is known in the art on the substrate 310. The gate dielectric 314 is preferably a high-K dielectric material, such as silicon oxide, silicon oxynitride, silicon nitride, an oxide, a nitrogen-containing oxide, a combination thereof, or the like. Other examples of such materials include aluminum oxide, lanthanum oxide, hafnium oxide, zirconium oxide, hafnium oxynitride, or combinations thereof.

In the preferred embodiment in which the gate dielectric layer 314 comprises an oxide layer, the gate dielectric layer 314 may be formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor.

The gate electrode 316 preferably comprises a conductive material, such as a metal (e.g., tantalum, titanium, molybdenum, tungsten, platinum, aluminum, hafnium, ruthenium), a metal silicide (e.g., titanium silicide, cobalt silicide, nickel silicide, tantalum silicide), a metal nitride (e.g., titanium nitride, tantalum nitride), doped poly-crystalline silicon, other conductive materials, or a combination thereof. In one example, amorphous silicon is deposited and recrystallized to create poly-crystalline silicon (poly-silicon).

A hard mask 317, which protects the underlying gate electrode 316 during etching processes, may comprise a nitrogen-containing layer, such as a silicon nitride ($Si_3N_4$) layer. The $Si_3N_4$ layer may be formed using CVD techniques using silane and ammonia as precursor gases. Other materials, such as silicon oxynitride $SiO_xN_y$, silicon oxime $SiO_xN_y:H_z$, or a combination thereof, may also be used to form the hard mask 317.

The gate dielectric 314, gate electrode 316, and hard mask 317 may be patterned by photolithography techniques as are known in the art. Generally, photolithography involves depositing a photoresist material, which is then masked, exposed, and developed. After the photoresist mask is patterned, an etching process may be performed to remove unwanted portions of the gate dielectric material and the gate electrode material to form the gate dielectric 314 and the gate electrode 316 as illustrated in FIG. 3a. In the preferred embodiment in which the gate electrode material is poly-crystalline silicon and the gate dielectric material is an oxide, the etching process may be a wet or dry, anisotropic or isotropic, etch process, but preferably is an anisotropic dry etch process.

Liners 318 and spacers 320 are formed alongside the gate electrode 316. Preferably, the liners 318 are formed of an oxide formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. Spacers 320 preferably comprise silicon nitride ($Si_3N_4$), or a nitrogen containing layer other than $Si_3N_4$, such as $Si_xN_y$, silicon oxynitride $SiO_xN_y$, silicon oxime $SiO_xN_y:H_z$, or a combination thereof. In a preferred embodiment, the spacers 320 are formed from a layer comprising $Si_3N_4$ that has been formed using chemical vapor deposition (CVD) techniques using silane and ammonia as precursor gases.

Source/drain regions 322 may be formed by ion implantation. The source/drain regions 322 may be implanted with an n-type dopant, such as phosphorous, nitrogen, arsenic, antimony, or the like, to fabricate NMOS devices or may be implanted with a p-type dopant, such as boron, aluminum, indium, and the like, to fabricate PMOS devices. Optionally, NMOS devices may be fabricated on the same chip as PMOS devices. In this optional embodiment, it may be necessary to utilize multiple masking and ion implant steps as are known in the art such that only specific areas are implanted with n-type and/or p-type ions.

It should be noted that a silicidation process may be performed. The silicidation process may be used to improve the conductivity of the conductive gate electrode 316, as well as to decrease contact resistance in the source/drain regions 322. The silicide may be formed by depositing a metal layer such as titanium, nickel, tungsten, or cobalt via plasma vapor deposition (PVD) procedures. An anneal procedure causes the metal layer to react with the conductive gate electrode 316 and the source/drain regions 322 to form metal silicide. Portions of the metal layer overlying insulator spacers 320 remain unreacted. Selective removal of the unreacted portions of the metal layer may be accomplished, for example, via wet etch procedures. An additional anneal cycle may be used if desired to alter the phase of silicide regions, which may result in a lower resistance.

It should also be noted that the above description is but one example of a transistor 312 that may be used with an embodiment of the present invention. Other transistors and other semiconductor devices may also be used. For example, the transistor may have raised source/drains, the transistor may be a split-gate transistor or a FinFET design, different materials and thicknesses may be used, multiple liners/spacers, or the like, may be used.

Figure 3B:
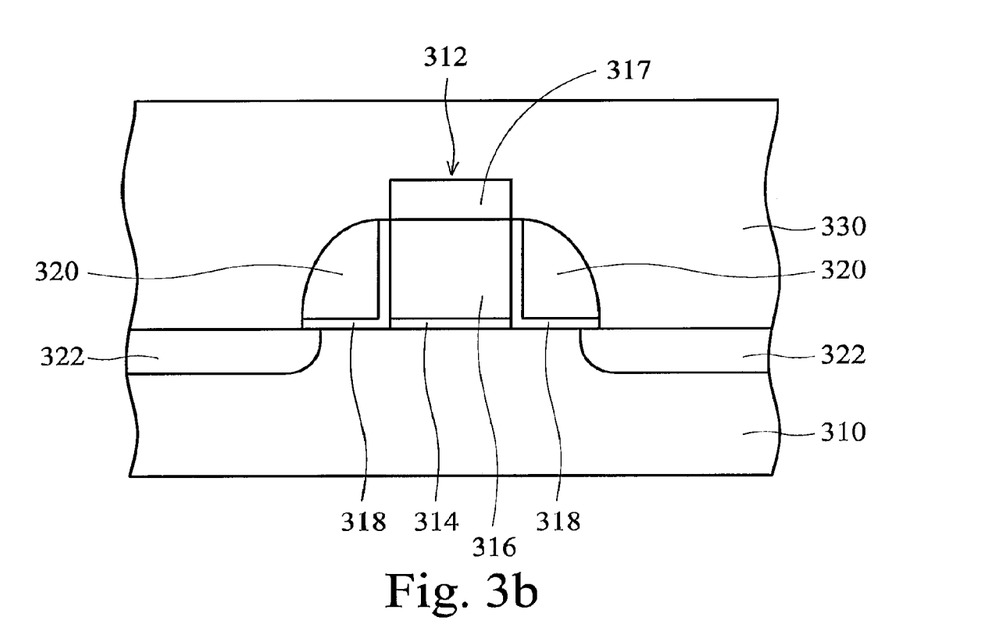

FIG. 3b illustrates formation of a dielectric layer 330 over the transistor 312 in accordance with an embodiment of the present invention. In an embodiment, the dielectric layer 330 is an oxide formed by any oxidation process, such as wet or dry thermal oxidation in an ambient comprising an oxide, $H_2O$, NO, or a combination thereof, or by chemical vapor deposition (CVD) techniques using tetra-ethyl-ortho-silicate (TEOS) and oxygen as a precursor. Preferably, the dielectric layer 330 is formed to a thickness at least as great as the height of the gate electrode 316 and hard mask 317.

Figure 3C:
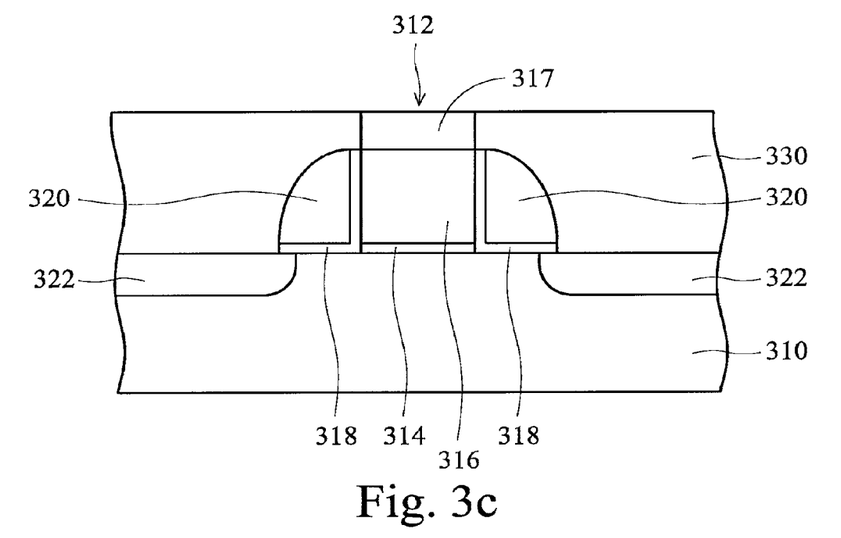

In FIG. 3c, a planarization process, such as a chemical-mechanical polishing (CMP) process, is performed in accordance with an embodiment of the present invention. The planarization process preferably stops on the hard mask 317 and creates a substantially planar surface.

Figure 3D:
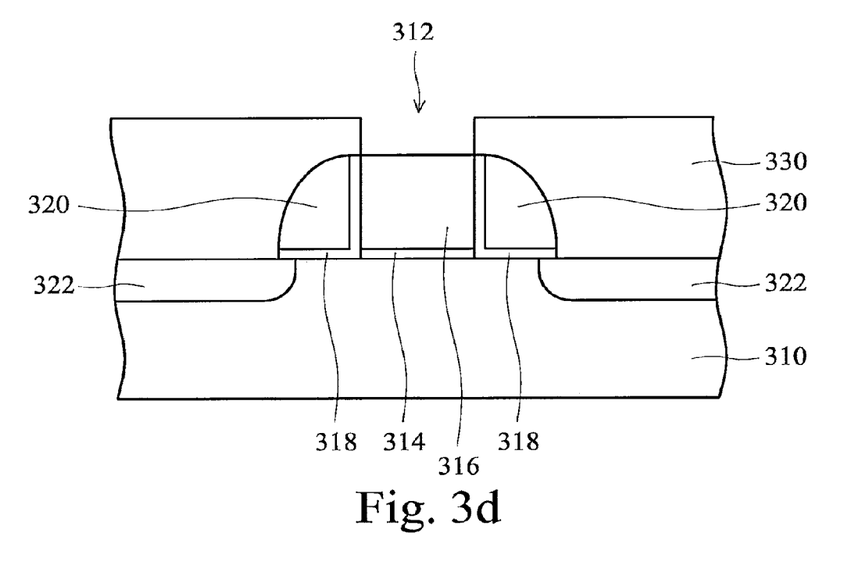

FIG. 3d illustrates the removal of the hard mask 317 in accordance with an embodiment of the present invention. In an embodiment in which the hard mask 317 is formed of silicon nitride, the hard mask 317 may be removed by a wet dip in a solution of phosphoric acid ($H_3PO_4$). As illustrated in FIG. 3d, the removal of the hard mask 317 exposes the gate electrode 316.

Figure 3E:
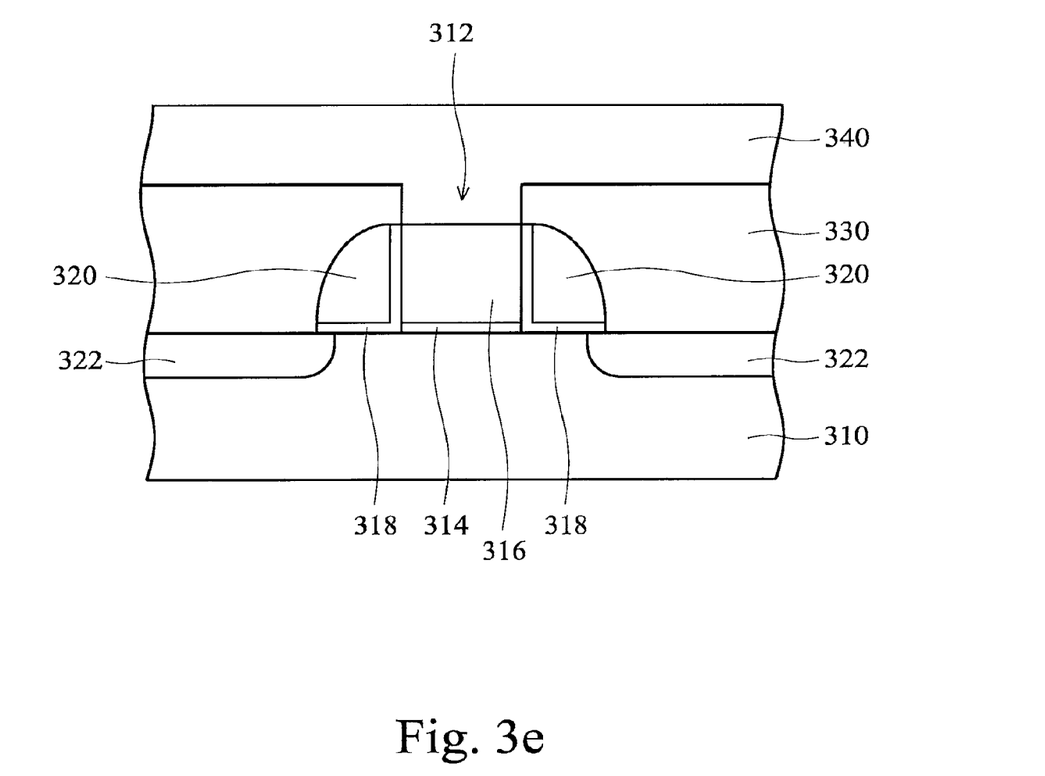

Thereafter, in FIG. 3e, a conductive layer 340 is formed and patterned in accordance with an embodiment of the present invention. Preferably, the conductive layer 340 comprises a doped poly-crystalline silicon. The conductive layer 340 may be patterned by photolithography techniques known in the art to form the word lines 222 in FIG. 2.

Thereafter, inter-layer dielectrics (ILDs) and metal layers may be formed as is known in the art. One of the metal layers would form the bit lines BL-1, BL-2, BL-3, and BL-4 of FIG. 2. Additionally, vias and other interconnect structures may be formed to complete fabrication.

Figure 4A:
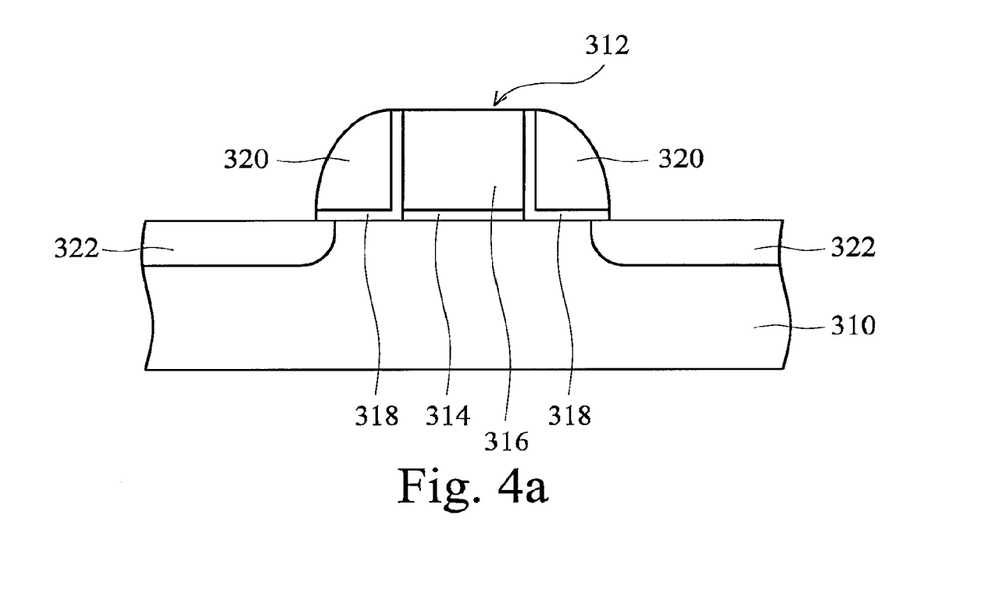
FIGS. 4a-4d are cross-sectional views of a wafer after various process steps are performed in accordance with an embodiment of the present invention.

FIGS. 4a-4d illustrate a second embodiment of the present invention. Referring first to FIG. 4a, a transistor is shown wherein like reference numerals refer to like elements of FIG. 3a. Generally, FIG. 4a is similar to FIG. 3a, except that the hard mask 317 is not required in the embodiment illustrated in FIG. 4a. As will be illustrated below, the embodiment illustrated in FIGS. 4a-4d does not utilize the hard mask 317 as an etch stop layer.

Figure 4B:
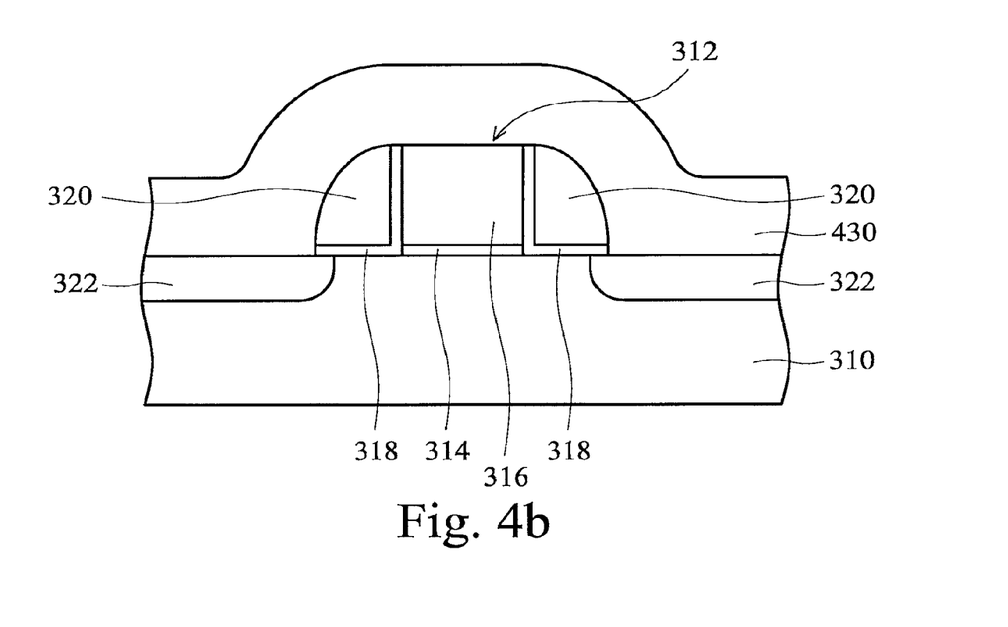

Referring now to FIG. 4b, a dielectric layer 430 is formed over the transistor 312 in accordance with an embodiment of the present invention. In an embodiment, the dielectric layer 430 is an oxide similar to the dielectric layer 330 in FIG. 3b, except whereas the thickness of the dielectric layer 330 in FIG. 3a is preferably at least as great as the height of the gate electrode 316, the thickness of the dielectric layer 430 of FIG. 4a may be thinner. Preferably, the dielectric layer 430 has a thickness between about 300 Å and about 500 Å. It should be noted that in FIG. 3a the dielectric layer 330 is planarized, in the present embodiment the dielectric layer 430 has a non-planar surface.

Figure 4C:
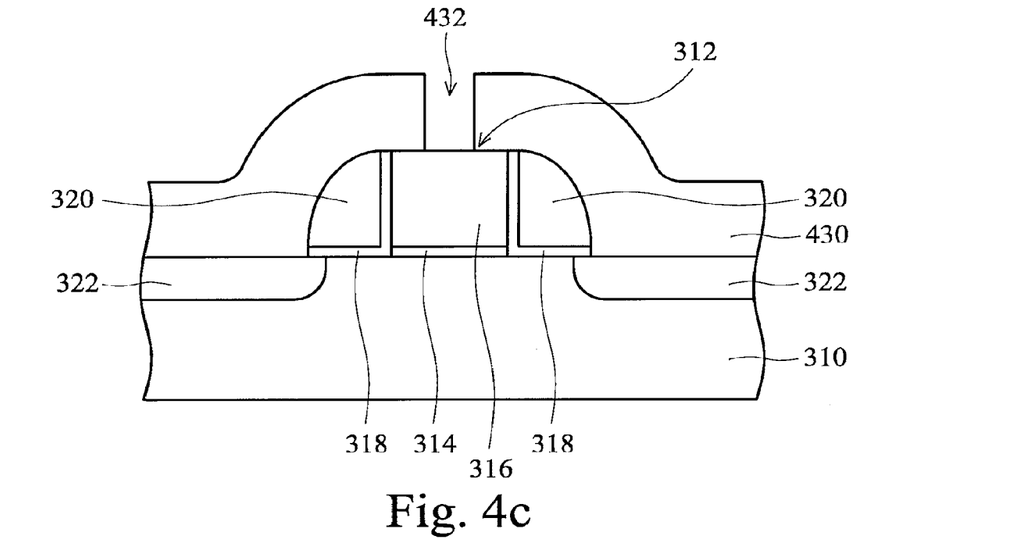

In FIG. 4c, a via 432 is formed in the dielectric layer 430 over the gate electrode 316 in accordance with an embodiment of the present invention. The via 432 exposes a portion of the gate electrode 316 and forms a contact point for the word line formed in subsequent steps. In an embodiment, the via 432 is formed by photolithographic techniques known in the art.

Figure 4D:
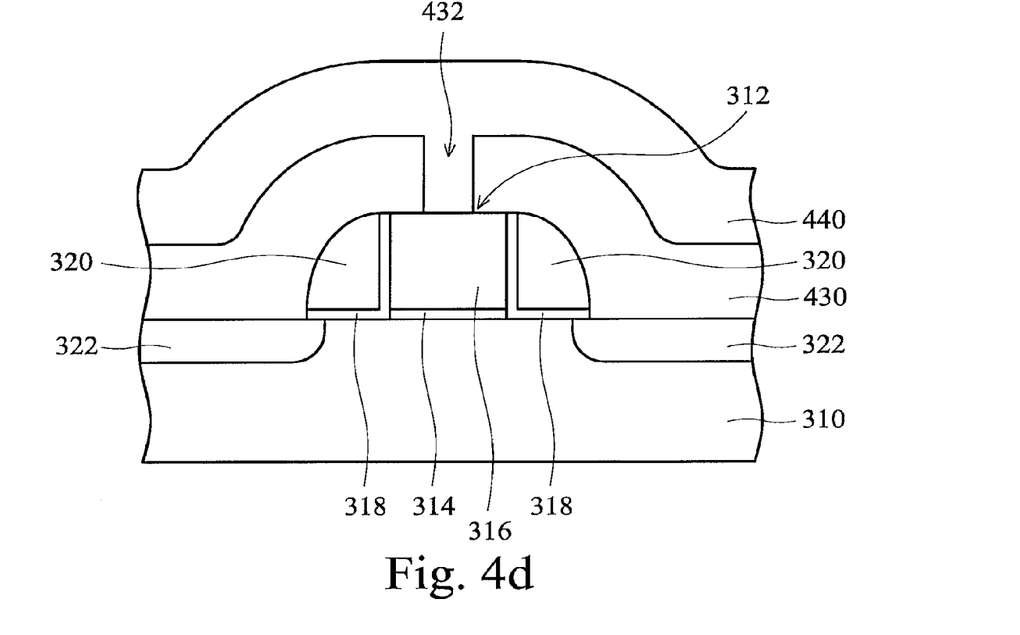

Thereafter, in FIG. 4d, a conductive layer 440 is formed and patterned in accordance with an embodiment of the present invention. Preferably, the conductive layer 440 comprises a doped poly-crystalline silicon. The conductive layer 440 may be patterned by photolithography techniques known in the art to form the word lines 222 in FIG. 2. It should be noted that in this embodiment the word lines 222 (e.g., the conductive layer 440 of FIG. 4d) have a non-planar surface.

Figure 5A:
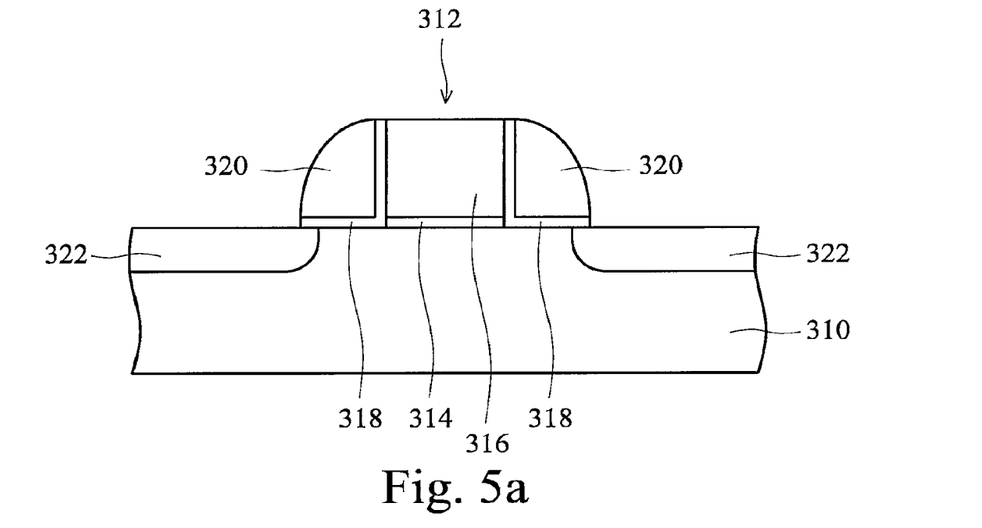
FIGS. 5a-5e are cross-sectional views of a wafer after various process steps are performed in accordance with an embodiment of the present invention.

FIGS. 5a-5e illustrate a third embodiment of the present invention. Referring first to FIG. 5a, a transistor is shown wherein like reference numerals refer to like elements in FIG. 3a and FIG. 4a.

Figure 5B:
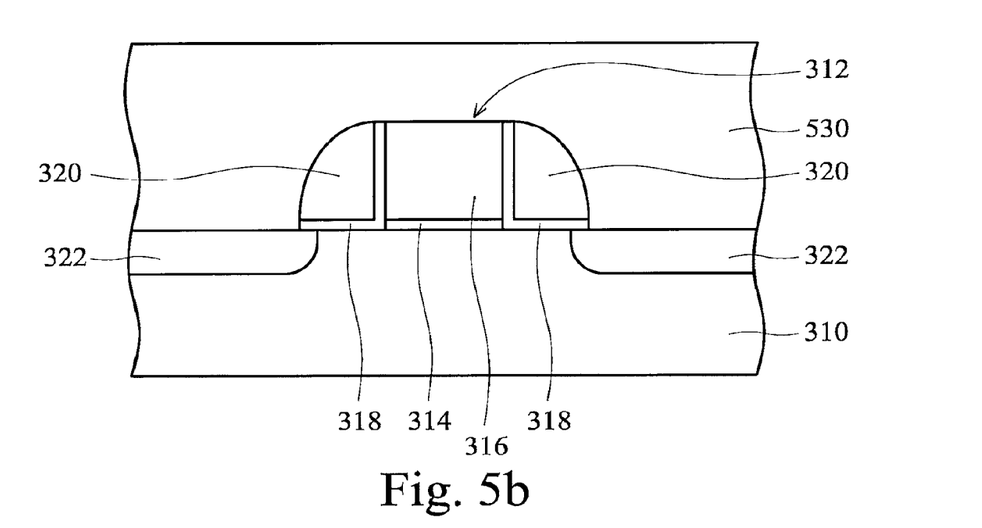

Referring now to FIG. 5b, a dielectric layer 530 is formed over the transistor 312 in accordance with an embodiment of the present invention. In an embodiment, the dielectric layer 530 is an oxide similar to the dielectric layer 330 in FIG. 3b and has a thickness greater than about 2000 Å above the gate electrode 316.

Preferably, a planarization process, such as a chemical-mechanical polishing (CMP) process, is performed to create a substantially planar surface. However, it is preferred that after the planarization process is complete, the remaining dielectric layer 530, positioned above the gate electrode, have a thickness greater than about 1000 Å.

Figure 5C:
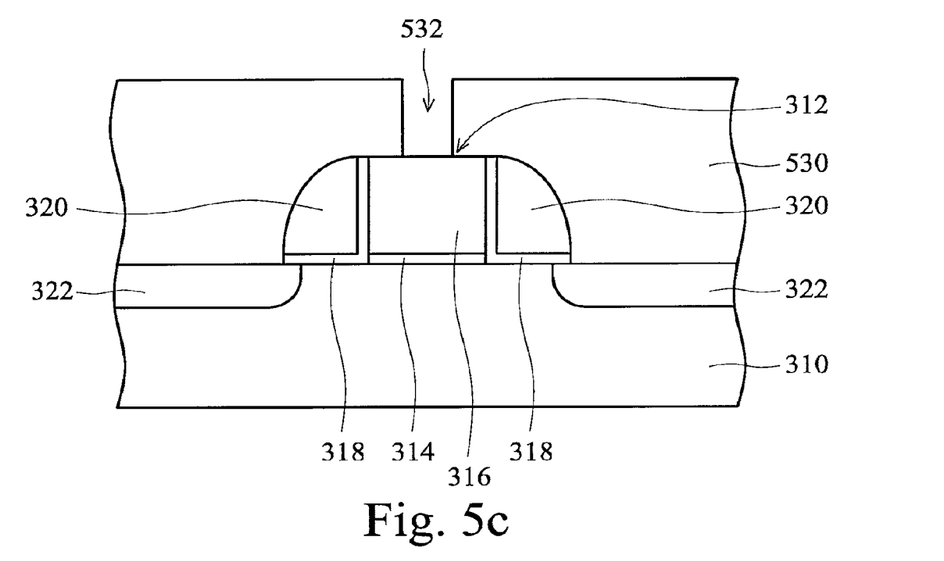

In FIG. 5c, a via 532 is formed in the dielectric layer 530 over the gate electrode 316 in accordance with an embodiment of the present invention. The via 532 exposes a portion of the gate electrode 316 and forms a contact point for the word line formed in subsequent steps. In an embodiment, the via 532 is formed by photolithographic techniques known in the art.

Figure 5D:
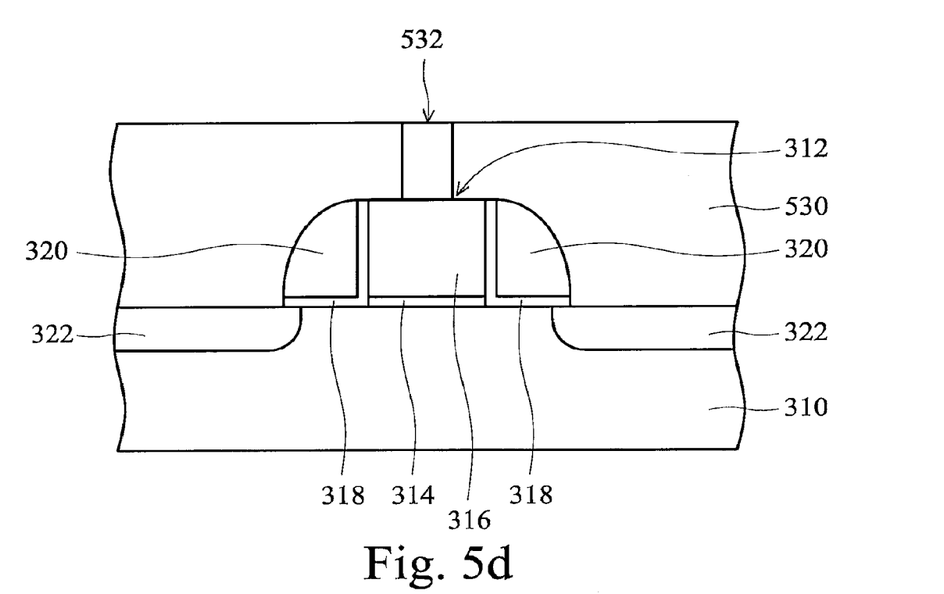

Thereafter, in FIG. 5d, the via 532 is filled with a conductive material in accordance with an embodiment of the present invention. In an embodiment, the via 532 is filled by depositing a doped poly-crystalline silicon and performing a planarization process (e.g., CMP) to create a substantially planar surface.

Figure 5E:
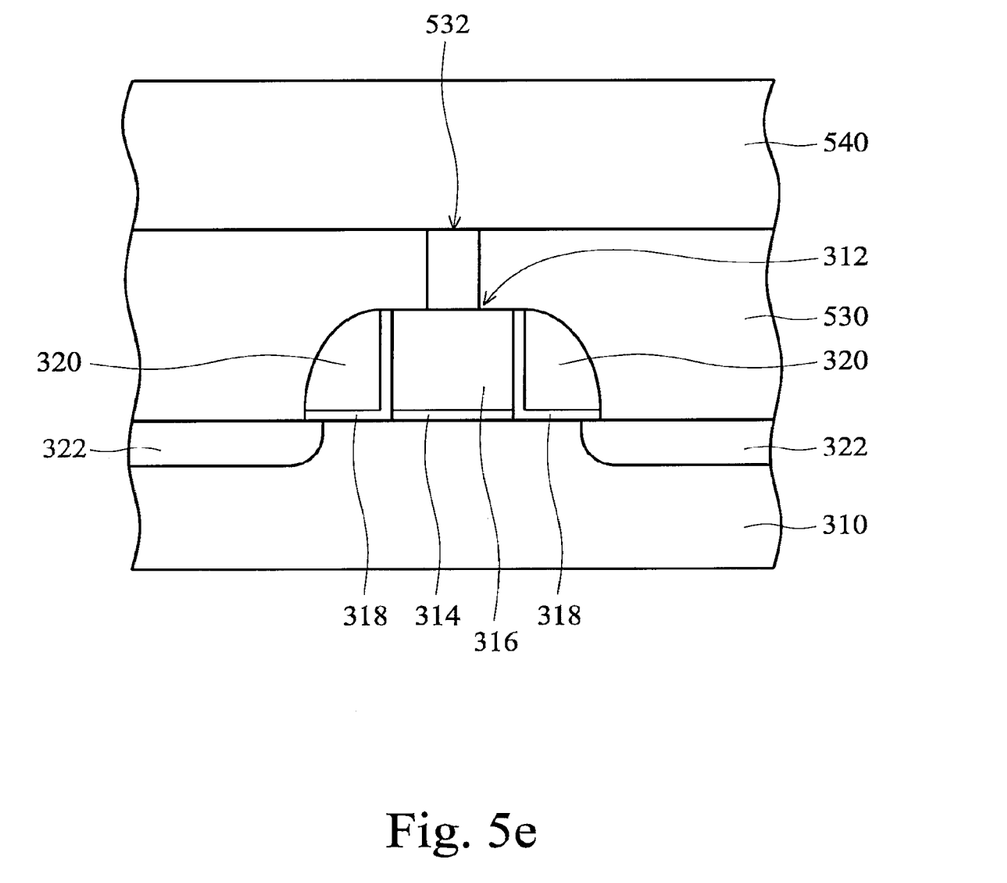

FIG. 5e illustrates forming and patterning a conductive layer 540 in accordance with an embodiment of the present invention. Preferably, the conductive layer 540 comprises a doped poly-crystalline silicon. The conductive layer 540 may be patterned by photolithography techniques known in the art to form the word lines 222 of FIG. 2. It should be noted that in this embodiment the word lines 222 (e.g., the conductive layer 540 of FIG. 5e) have a substantially planar surface.

As one skilled in the art will appreciate, by placing the storage transistors between the longitudinal active regions, the pitch of the active regions, and the dimensions of the memory cell, may be reduced. This allows for further scaling of the memory arrays as compared to the prior art.

It should be noted that embodiments of the present invention may utilize different processes. For example, the word lines 222 may be formed of a conductive material other than poly-silicon, such as a metal (e.g., tantalum, titanium, molybdenum, tungsten, platinum, aluminum, hafnium, ruthenium, copper), a metal silicide (e.g., titanium silicide, cobalt silicide, nickel silicide, tantalum silicide), a metal nitride (e.g., titanium nitride, tantalum nitride). In some of these embodiments, it may be desirable to form the word lines in the metal 1 layer and the bit lines in the metal 2 layer.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory device comprising:
    a first active region in a substrate;
    a second active region in the substrate, the first and second active regions having substantially parallel longitudinal axes;
    a plurality of transistors positioned between the first active region and the second active region such that each of the plurality of transistors utilizes the first active region and the second active region as source/drain regions, each of the plurality of transistors having a gate electrode, each of the gate electrodes having a rectangular shape and having a longitudinal axis substantially parallel to the longitudinal axes of the first and second active regions; and
    a plurality of word lines, each of the plurality of word lines comprising a separate layer from the gate electrode, each of the plurality of word lines being electrically coupled to one or more of the gate electrodes.

2. The memory device of claim 1, wherein the plurality of transistors comprises silicon-oxide-nitride-oxide-silicon (SONOS) transistors.

3. The memory device of claim 1, wherein the plurality of transistors is capable of storing two bits of information.

4. The memory device of claim 1, wherein the word lines have longitudinal axes substantially perpendicular to the longitudinal axes of the first active region and the second active region.

5. The memory device of claim 4, wherein the word lines are formed of poly-silicon.

6. The memory device of claim 4, wherein the word lines are formed of a metal.

7. The memory device of claim 1, further comprising bit lines having longitudinal axes substantially parallel to the longitudinal axes of the first active region and the second active region.

8. The memory device of claim 1, further comprising a dielectric layer over the plurality of transistors.

9. The memory device of claim 8, wherein the dielectric layer has a substantially planar surface.

10. A memory device comprising:
    a plurality of transistors, each transistor having a gate, a source region, and a drain region, the source regions of the plurality of transistors sharing a first common active region, the drain regions of the plurality of transistors sharing a second common active region, and the first common active region and the second common active region having substantially parallel longitudinal axes and having non-linear edges; and
    word lines electrically coupled to the gates using contacts through a dielectric layer, the word lines having longitudinal axes substantially perpendicular to the longitudinal axes of the first common active region and the second common active region.

11. The memory device of claim 10, wherein the plurality of transistors comprises silicon-oxide-nitride-oxide-silicon (SONOS) transistors.

12. The memory device of claim 10, wherein the plurality of transistors stores two bits of information.

13. The memory device of claim 10, wherein the word lines are formed of poly-silicon.

14. The memory device of claim 10, further comprising bit lines having longitudinal axes substantially parallel to the longitudinal axes of the first common active region and the second common active region.

15. The memory device of claim 10, wherein the word lines are formed of a metal.

16. The memory device of claim 4, wherein the word lines have a non-planar surface.

17. The memory device of claim 1, further comprising a dielectric layer overlying the plurality of transistors and poly-silicon word lines overlying the dielectric layer, each of the poly-silicon word lines being electrically coupled to one or more of the plurality of transistors.

18. The memory device of claim 17, wherein the dielectric layer has a non-planar surface.

19. The memory device of claim 10, wherein the dielectric layer is interposed between the plurality of transistors and the word lines, the word lines being electrically coupled to one or more of the plurality of transistors, the word lines having a non-planar surface.

20. The memory device of claim 10, wherein the dielectric layer is interposed between the plurality of transistors and the word lines, the word lines being electrically coupled to one or more of the plurality of transistors, the word lines having a substantially planar surface.

* * * * *

UNITED STATES PATENT AND TRADEMARK OFFICE
CERTIFICATE OF CORRECTION

PATENT NO. : 7,538,384 B2
APPLICATION NO. : 11/294280
DATED : May 26, 2009
INVENTOR(S) : Lee

It is certified that error appears in the above-identified patent and that said Letters Patent is hereby corrected as shown below:

On the Title Page, Section (56) References Cited, U.S. PATENT DOCUMENTS, insert --4,964,080 10/90 Tzeng--.
On the Title Page, Section (56) References Cited, U.S. PATENT DOCUMENTS, insert --6,524,913 B1 2/03 Lin, et al.--.
On the Title Page, Section (56) References Cited, U.S. PATENT DOCUMENTS, insert --2002/0149958 A1 10/02 Kunikiyo--.
On the Title Page, Section (56) References Cited, U.S. PATENT DOCUMENTS, insert --2003/0134477 A1 7/03 Lin, et al.--.

Signed and Sealed this

Fifteenth Day of June, 2010

David J. Kappos
*Director of the United States Patent and Trademark Office*